United States Patent
Landa

(10) Patent No.: US 9,425,529 B2
(45) Date of Patent: Aug. 23, 2016

(54) INTEGRATED CIRCUIT CHIP TESTER WITH AN ANTI-ROTATION LINK

(71) Applicant: Titan Semiconductor Tool, LLC, Ladera Ranch, CA (US)

(72) Inventor: Victor Landa, Ladera Ranch, CA (US)

(73) Assignee: XCERRA CORPORATION, Norwood, MA (US)

( * ) Notice: Subject to any disclaimer, the term of this patent is extended or adjusted under 35 U.S.C. 154(b) by 0 days.

(21) Appl. No.: 14/310,824

(22) Filed: Jun. 20, 2014

(65) Prior Publication Data

US 2015/0372407 A1 Dec. 24, 2015

(51) Int. Cl.
| | | |
|---|---|---|
| H01R 13/64 | (2006.01) |
| H01R 12/85 | (2011.01) |
| H01R 12/70 | (2011.01) |
| H01R 13/22 | (2006.01) |

(52) U.S. Cl.
CPC ........... *H01R 12/85* (2013.01); *H01R 12/7005* (2013.01); *H01R 12/7076* (2013.01); *H01R 13/22* (2013.01)

(58) Field of Classification Search
CPC ............. H01R 12/85; H01R 12/7005; H01R 12/7076; H01R 13/22
USPC ............... 439/66, 67, 81, 91, 493, 331, 219; 324/754.03
See application file for complete search history.

(56) References Cited

U.S. PATENT DOCUMENTS

| | | | |
|---|---|---|---|
| 5,841,640 A | 11/1998 | Shibata | |
| 6,406,312 B1* | 6/2002 | Heitkamp | H01R 12/7005 361/754 |
| 6,409,521 B1* | 6/2002 | Rathburn | 439/66 |
| 7,338,293 B2 | 3/2008 | Gilk | |
| 7,625,219 B2* | 12/2009 | Osato | H01R 13/2435 439/71 |
| 7,632,106 B2* | 12/2009 | Nakamura | G01R 1/0466 439/591 |
| 7,688,094 B2* | 3/2010 | Osato | G01R 31/31905 324/754.03 |
| 7,737,708 B2 | 6/2010 | Sherry | |
| 7,914,295 B2* | 3/2011 | Nakamura | G01R 1/0466 439/331 |
| 7,918,669 B1* | 4/2011 | Tiengtum | G01R 1/0466 324/754.03 |
| 7,955,092 B2* | 6/2011 | Yang | G01R 1/0466 439/72 |

(Continued)

OTHER PUBLICATIONS

Itzhak Green (Member, STLE) and Capel English, Analysis of Elastomeric 0-Ring Seals in Compression Using the Finite Element Method ©, Feb. 13, 1991, STLE Tribology Transaction, vol. 35(1992), 1, 83-88.*

M. J. Puttock and E. G. Thwaite, Elastic Compression of Spheres and Cylinders at Point and Line Contact, 1969, Commonwealth Scientific and Industrial Research Organization, Australia, Melbourne, National Standards Laboratory Technical Paper No. 25.*

(Continued)

*Primary Examiner* — Tulsidas C Patel
*Assistant Examiner* — Peter G Leigh
(74) *Attorney, Agent, or Firm* — Fulwider Patton LLP

(57) ABSTRACT

A socket for testing or connecting an integrated circuit is disclosed having a platform for receiving the integrated circuit and adapted to overlay a piece of test equipment or other board, the platform formed with an array of slots each locating a portion of a two-piece connector assembly. When the integrated circuit is seated on the platform, the two piece connector assemblies pivot so as to make contact between a contact pad on the IC and the board for establishing or evaluating signal transmission by the IC. The platform houses a resilient elongate elastomer that biases the connector assembly out of the platform to make contact with the board or test equipment. When the IC is placed on the platform, the bias of the resilient tubular member is overcome and an electrical connection is established across the connector assembly.

4 Claims, 4 Drawing Sheets

(56) References Cited

U.S. PATENT DOCUMENTS

| | | | |
|---|---|---|---|
| D668,625 S * | 10/2012 | Tiengtum | D13/182 |
| 8,758,027 B1 * | 6/2014 | Landa | G01R 1/0466 439/66 |
| 2009/0035960 A1 | 2/2009 | Osato et al. | |
| 2009/0053912 A1 | 2/2009 | Lopez et al. | |
| 2012/0129361 A1 | 5/2012 | Masuda et al. | |

OTHER PUBLICATIONS

International Search Report for related PCT/US15/27136 filed Apr. 22, 2015.

* cited by examiner ated CIRCUIT CHIP TESTER
WITH AN ANTI-ROTATION LINK

BACKGROUND

The present invention relates to a socket that electrically connects an integrated circuit with an IC board. More particularly, the present invention is directed to a socket, such as those used for testing or connecting an integrated circuit, that incorporates an array of two-piece connectors that achieve a positive connection between an IC device under test (DUT) and a board, such as a load board of a piece of test equipment or other fixture.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

Whether it is for testing integrated circuits or for mounting such circuits on a board, appropriate socket-like connectors are needed. Factors such as cost, having a low profile, and shortening the electrical signal path drive the industry to constantly seek to improve on the prior art sockets. A solution to the foregoing was provided by U.S. Pat. No. 7,918,669 to Tiengtum, and assigned to the present assignee, the contents of which are fully incorporated herein by reference. A feature of that device was a cylindrical elastomer that provided a resilient biasing of the connectors, which allowed the testing device to reliably make effective contact with the device under test (DUT). This cylindrical elastomer, however, wears quickly and begins to deform after multiple uses, reducing its effectiveness. Once it begins to wear, it can twist, which leads to further wear and loss of resiliency. This leads to an issue with the connector establishing reliable contact under certain conditions. The present invention addresses those issues.

SUMMARY OF THE INVENTION

The present invention is a socket for an integrated circuit having a series of contact pads or other electrical connection sites linearly arranged preferably along at least one peripheral edge, the socket including a platform that supports the IC and houses a plurality of connectors that when engaged with the integrated circuit's contact pads, complete an electrical connection between the contact pads and the associated fixture's contacts below the platform. The socket's platform may have a plurality of generally parallel slots for aligning and receiving a corresponding plurality of electrical contacts, one in each slot. Each electrical contact path is formed of a two piece linkage that cooperates to form an electrical connection between the contact pad and the fixture's contact. The two pieces of the contact cooperate together to form a reliable electrical connection between the IC and the board.

The two piece connector assembly is arranged to pivot into an engaged position without deformation of the elements. Deformation is advantageously avoided because components that deform can lose their resiliency and lead to diminished contact or failure of the socket with repeated life cycles. In the present invention, a first piece of the contact is referred to as a "mount" and has generally planar, parallel upper and lower surfaces and a side surface formed with a rounded, bulbous cavity having a slightly upwardly tilted orientation. The rounded cavity is substantially semi-circular with a slightly expanding mouth that accommodates favorable purchase of a rocker arm described below. The rounded cavity transitions along an upper section to the planar upper surface through a curved, finger-like projection, and further transitions at its lower section to define a lip member that slopes upwardly away from the lower surface. The lip member has a curved lower edge that roughly tracks its curved upper edge defining the cavity, and both the upper edge and the lower edge terminate at a forward facing leading edge.

The mount is fixed in the platform so as to remain immobile, and preferably includes a compressive preload from the platform above the upper surface so as to embed the mount slightly into the load board below. In a preferred embodiment, the mount is formed with an angled back surface that wedges into the platform, preventing movement of the mount during the testing operation. The fixed mount functions to receive and act like a fulcrum to a pivot a second member, i.e. the link.

The link is formed with an arcuate upper surface that acts as a contact point that makes connect with the associated contact pad (or pin) of the IC. The arcuate upper surface has a curvature that maintains a smooth, rolling contact with the IC's contact pad as the curved upper surface rotates through its initial stand-by position through its engaged position. Projecting laterally outward and away from the arcuate upper surface of the link is a rocker arm having a neck portion leading to a rounded tip. The rounded tip of the rocker arm is sized to mate with the cavity in the mount and provide for a ball and socket type pivoting movement of the link. That is, the rounded tip of the link when seated in the mount's cavity, can rotate about the end of the rounded tip as the neck of the rocker arm swings between the surfaces defining the mouth of the cavity, i.e., between a stand-by or disengaged position where the link is not in contact with both the IC and the test device below, and an engaged position where the link is firmly in contact with mount and the circuit is complete.

An elongate, resilient elastomer is positioned behind and beneath the link member to bias the link member into the stand-by or disengaged position when no IC is present. The elongate, resilient elastomer is located in the platform in a cavity shaped to retain the elastomer. When an IC is brought to bear against the test socket, the contact pad of the IC pushes the arcuate upper surface of the link downward against the bias of the elastomer. The elastomer maintains the rocker arm of the link in contact with the surface of the mount's cavity. As the force of the downward movement of the IC chip overcomes the elastomer's bias, the link will rotate about the mount and the engagement of the rocker arm in the cavity will be forcefully established by the lateral force of the tubular resilient member. The mount has a lower surface that is mated with the electrical contact of the load board or other fixture, and the link is firmly in contact with the IC contact pad. Thus, the interconnection of the rocker arm with the mount's socket completes the circuit between the IC DUT and the associated fixture.

The elastomer can be shaped in a square profile, having a first corner that is rounded in a preferred embodiment. The elastomer is seated in a wedge-shaped support so that the rounded corner faces upward and makes contact with the link. The square shape of the elastomer ensures that the link makes greater contact with the link as compared with a cylindrical elastomer, which only makes contact tangentially as opposed to a full face of the square. The elastomer can only operate in two stages of force by incorporating a longitudinal hole through the middle of the elastomer. The hole provides an additional level of force which can be used to secure the connection and improve the contact while increasing the range of compliance without sacrificing life of the elastomer. When the link first makes contact with the elastomer, it compresses more easily because of the presence of the hole in the center. Thus, a smaller force is applied to the link. However, once the compression of the elastomer closes the hole, the full remaining cross section of the elastomer opposes further compression, thereby increasing the force on the link. This increased force ensures greater connection with the device under test, while not prematurely wearing the elastomer during the initial contact phase.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

Figure 1:
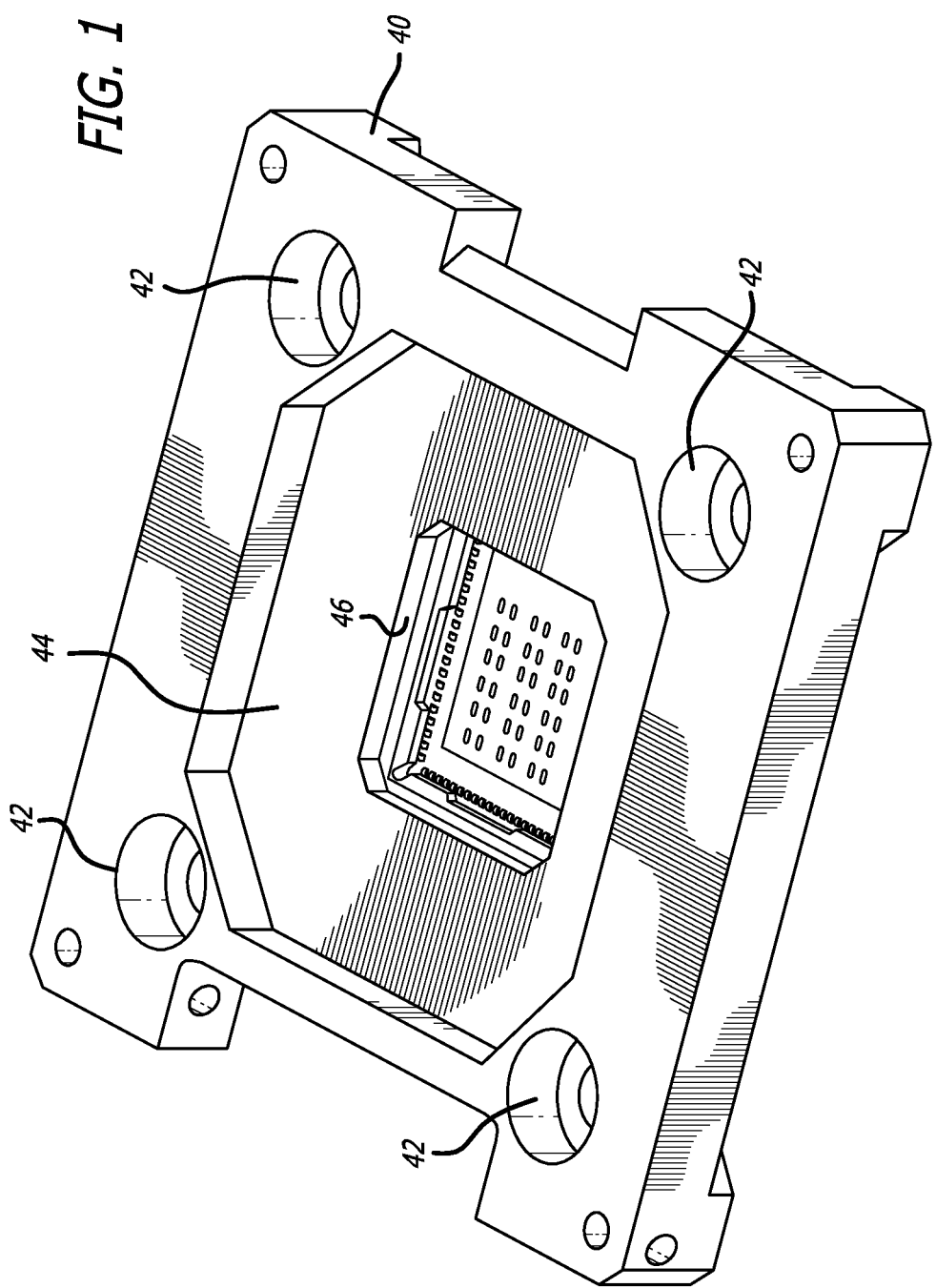
FIG. 1 is an elevated, perspective view of an embodiment of the test socket of the present invention.

FIG. 1 illustrates an integrated circuit test socket 40 of the type generally described in U.S. Pat. No. 7,918,669, the contents of which are incorporated herein. The test socket 40 has a generally square profile with up to four aligning holes 42 to mount the test socket on the testing equipment. On a platform 44 of the test socket 40, a square recess 46 is formed to receive the integrated circuit chip 14 under test. A plurality of electrical connectors are formed within the recess 46 as described more fully in the '669 patent referenced above. Once the chip 14 is placed in the recess 46, the test socket 40 may be placed, for example, in a handler work press and clamped in the handler in anticipation of testing the integrated chip. Other arrangements, both automated and manual, are also possible with the present invention.

Figure 2:
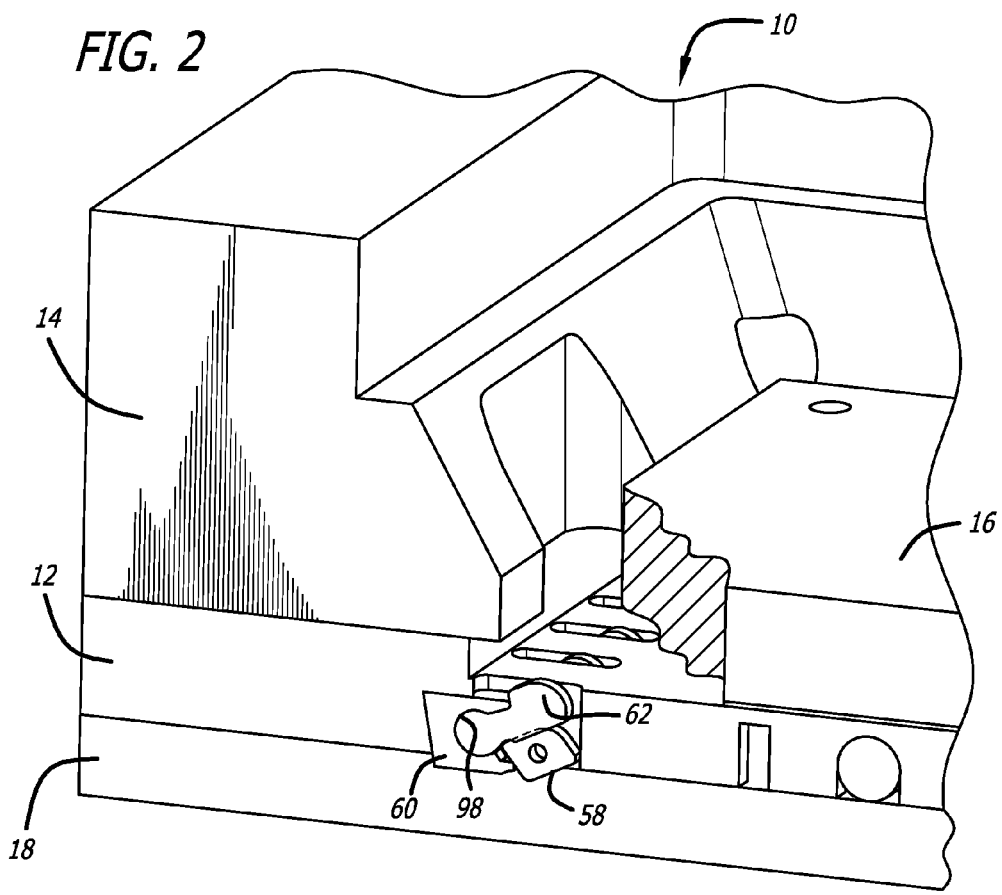
FIG. 2 is an enlarged, elevated cut-away view of a portion of a test socket illustrating the connector structure.
Figure 3:
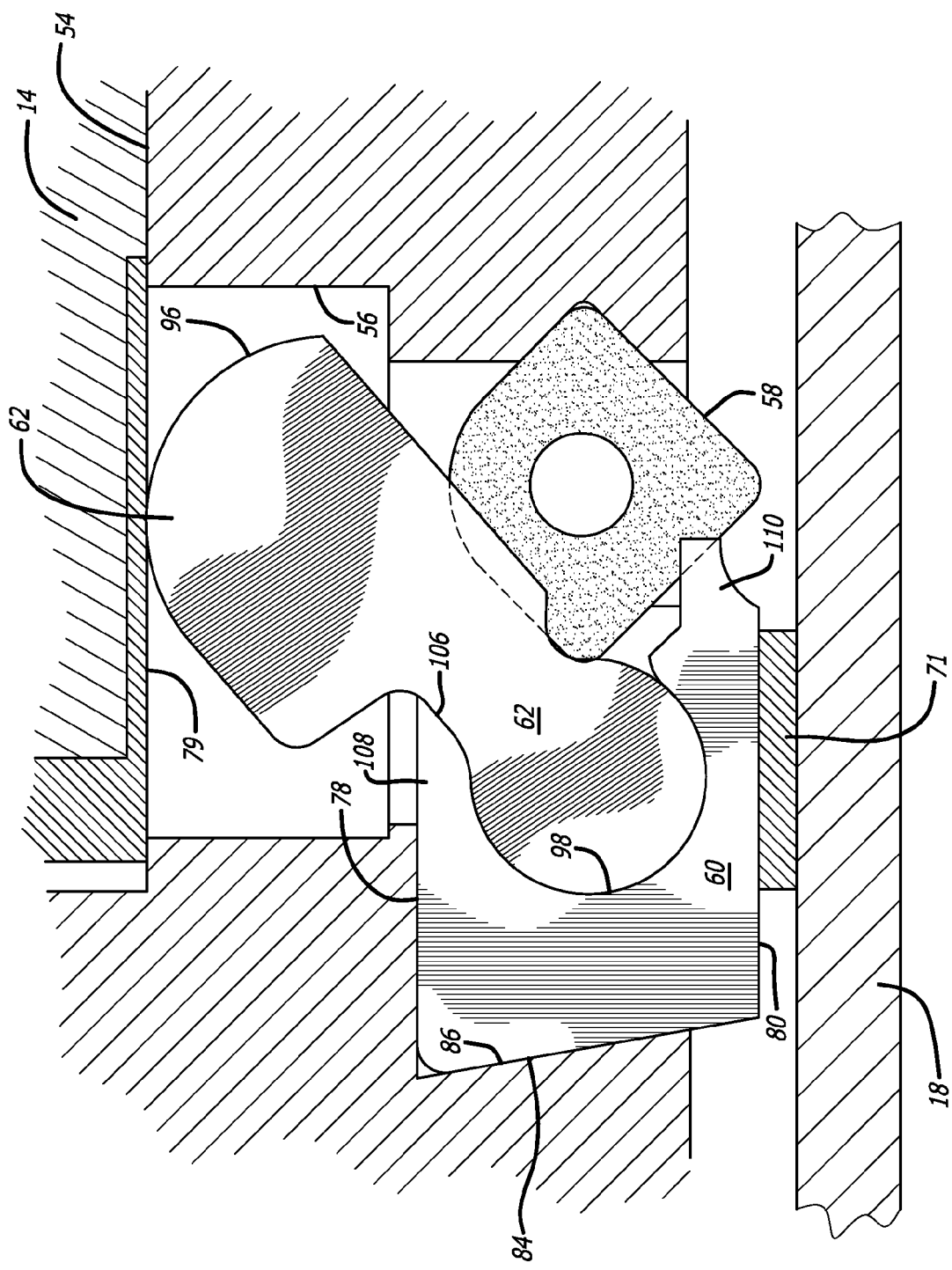
FIG. 3 is an enlarged, cross-sectional view of the link and mount in the engaged position.
Figure 4:
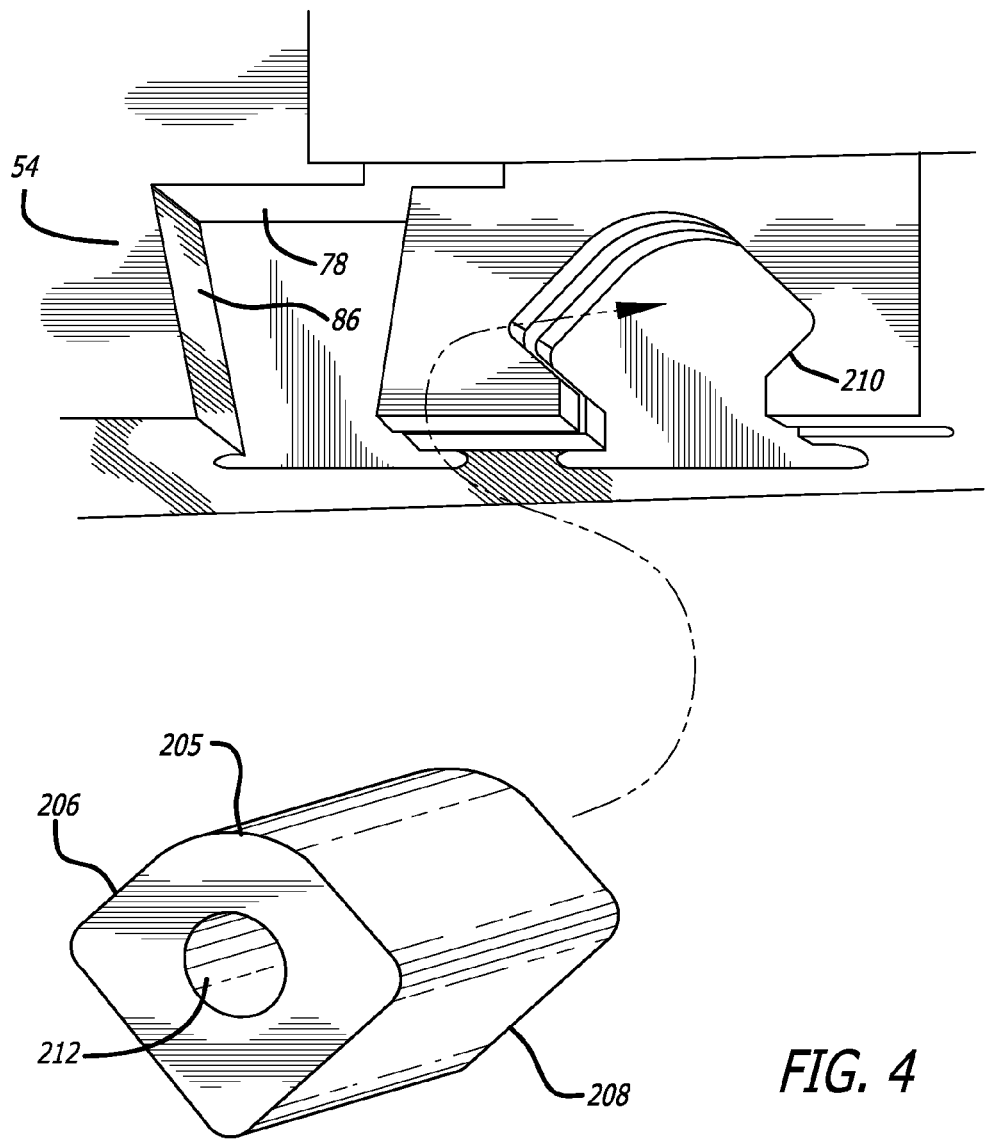
FIG. 4 is an exploded view of the elastomer and wedge-shaped support.

FIG. 2 illustrates the electrical connectors that cooperate with the test socket to make the contacts needed to test the DUT. The test socket 40 sits on a pad 18 as part of the test equipment that can receive electrical signals from the IC and assess the quality, strength, and other characteristics of the signal. The purpose of the test socket 40 is to electrically pass signals from the contact pad of the chip to the test equipment below via a plurality of connector assemblies 52 within a platform 12. Each connector assembly 52 pivots between a stand-by or disengaged position where no IC is present (as shown in FIG. 3), and an engaged position, where the engaged position corresponds to the completed electrical circuit between the IC 14 and the test equipment pad 18 through the connector assemblies 52. The platform 54 of the socket 40 has a plurality of slots 56 that allow a portion of the connector 52 to emerge from its upper surface as shown in FIG. 2. As explained in more detail in U.S. Pat. No. 7,918,669, when the IC chip 14 is placed on the platform 54, the connectors 79 of the IC chip 14 contact a portion of connector assembly 52 protruding through the slots 56, and cause the connector assembly 52 to pivot into the engaged position (FIG. 3). In this way, the electrical contact is established reliably and automatically when the IC is placed on the test socket platform 54.

The connector assembly 52 that establishes an electrical connection is a two piece assembly having a link member 62 and a mount element 60. An elongate resilient elastomer 58 is housed in the platform 54, and serves to bias the connector assembly 52 in the disengaged position. The mount 60 is retained in the platform 54 and includes a generally planar upper surface and a generally planar lower surface. In a preferred embodiment, the platform 54 is sized to compress the mount 60 slightly so that it extends into and slightly embeds the test equipment contact surface below. Between the lower and upper surfaces is a laterally opening cavity having a slightly upwardly tilted orientation. The cavity is substantially circular up to a mouth, which then gradually widens toward the link 62, and the cavity is approximately sized to retain a portion of the link member therein. The upper edge of the mouth transitions to the upper surface through a curved finger-like projection. Similarly, the lower edge of the mouth transitions to the lower surface through a projecting lip member. The lip member has a lower edge that curves upward to a front edge.

When the IC is brought to bear against the platform 54, the lower surface of the IC contacts the protruding arcuate surface of the link 62 and pushes the link down against the bias of the elongate resilient elastomer 58. This downward force brought to bear by the IC 14 rotates the link counter-clockwise against the bias of the resilient elastomer 58 (which pushes up on the link), as the link 62 pivots about the mount 60 via the rocker arm. This is the engaged position (FIG. 3), as there is a direct flow path between the contact pad 79 of the IC 14, through the arcuate contact surface of the link 62 and through the rocker arm to the mount 60, which is embedded on and affixed to a lead 71 of the load board/test equipment 18. The flow path being established, signals can then be processed by the test equipment 18 from the IC 14 in the conventional manner.

FIG. 3 illustrates the mounts 60 and link 62 and the elongate resilient elastomer 58. Each mount 60 includes a generally planar upper surface 78 and a generally planar lower surface 80, and in a preferred embodiment the mount includes an angled side wall 84 that cooperates with a similarly angled surface 86 within the platform to "trap" or capture the mount in place. This cooperation between the angled wall and angled surface fixes the mount in place and reduces any jostling of the mount 60 to establish a more reliable connection in the connector assembly 52.

Between the lower and upper surfaces of the mount 60 is a laterally opening cavity 106 having a slightly upwardly tilted orientation. The cavity 106 is substantially circular up to a mouth, which then gradually widens as it opens toward the link 62, and the cavity 106 is approximately sized to retain a portion of the link 62 therein. The upper edge of the mouth transitions to the upper surface 78 through a curved finger-like projection 108. Similarly, the lower edge of the mouth transitions to the lower surface 80 through a projecting lip member 110.

The link 62 has two main components. The first component is an arcuate contact surface 96 along the upper edge that is shaped to permit rolling contact with the IC 14 above as the IC applies a downward force on the link 62, causing the link 62 to pivot about the mount 60. The second component of the link 62 is a rocker arm 98 having a neck portion that terminates in a bulb-shaped distal tip. The cavity 106 of the mount 60 and the bulb-shaped distal tip of the rocker arm 98 are complimentary sized to allow smoothing pivoting of the rocker arm within the cavity of the mount in a controlled manner without undue wobble.

When no chip is present, the resilient member 58 biases the rocker arm 98 of the link 62 upward through the slot 56 of the platform 12. This is the disengaged or stand-by position as the connection assembly 52 is ready for the presence of the IC chip. When a chip 14 is placed on the platform, the link 62 rotates downward and contact is made between the chip's electrical contacts 79 and the link 62, which completes a circuit with the mount 60, contact pad 71, and the testing device 18 to relay the signals from the chip to the testing device.

The elongate resilient elastomer 58 is substantially square with a rounded upper surface 205 arcing across an upper half of the member from a midpoint of one side 206 to a midpoint of the opposite side 208. The elastomer 58 sits in a wedge-shaped support 210 with the rounded upper surface 205 exposed to the link 62, adjacent the mount 60. In a preferred embodiment, the elastomer 58 includes a longitudinal channel or hole 212 that establishes a void in the elastomer 58. This creates a two-stage contraction of the elastomer 58 when compressed by the connector assembly 52. In the initial stage, the elastomer will collapse more easily due to the presence of the void 212, and the link will be biased with less force than a solid elastomer. However, as the link continues to squeeze the elastomer, the void will be reduced until it is eliminated, whereupon further compression requires greater force to collapse the elastomer. This two stage compression, where a first phase compresses the elastomer when a void is still in place, and a second phase where the void is no longer present or effective in reducing the compression response, extends the life of the elastomer by preventing undue wear and strain during the initial phase of the biasing.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

I claim:

1. A socket for electrically coupling an integrated circuit (IC) to a board so that a signal may be transmitted thereto, comprising:
   a platform for receiving the integrated circuit thereon;
   a plurality of two-piece connector assemblies, each connector assembly comprising a mount and an associated link pivotable about the mount;
   each mount retained in the platform and comprising a curved cavity on a lateral side opposite an associated link member;
   each link member including an arcuate contact surface on an upper side and extending above the platform, said link adapted for rolling contact with the integrated circuit, and a rocker arm with a rounded end seated in the curved cavity of the mount;
   an elongate elastomer seated below the plurality of link members having a first stage compression response and a second stage compression response;
   wherein contact between the integrated circuit and the platform pivots the link against a biasing of the elongate elastomer through the first stage compression response to the second stage compression response,
   wherein the first and second stage compression responses are established by a hole in the elongate elastomer.

2. The socket of claim 1, wherein the elongate elastomer is square shaped and seated in a wedge shaped support.

3. The socket of claim 2, wherein the elongate elastomer has a rounded upper corner extending from the wedge shaped support.

4. The socket of claim 1, wherein the platform includes an angled side wall that engages an angled opposed surface of the mount to capture the mount in the platform.

* * * * *